United States Patent
Jyo et al.

[11] Patent Number: 6,088,820
[45] Date of Patent: Jul. 11, 2000

[54] STATIC SEMICONDUCTOR MEMORY DEVICE HAVING TEST MODE

[75] Inventors: Ken Jyo; Shigeki Ohbayashi, both of Hyogo, Japan

[73] Assignee: Mitsubishi Denki Kabushiki Kaisha, Tokyo, Japan

[21] Appl. No.: 09/094,452

[22] Filed: Jun. 10, 1998

[30] Foreign Application Priority Data

Dec. 24, 1997 [JP] Japan ................................. 9-354955

[51] Int. Cl.⁷ .......................... G11C 29/00; G11C 7/00
[52] U.S. Cl. ...................... 714/718; 714/718; 365/201
[58] Field of Search ................................. 365/201, 203, 365/200; 714/718, 42; 324/158.1, 76.11

[56] References Cited

U.S. PATENT DOCUMENTS 5,285,418  2/1994  Yamaguchi ............................. 365/201
5,446,694  8/1995  Tanake et al. .......................... 365/203
5,694,364  12/1997  Morishita et al. ...................... 365/201
5,917,765  6/1999  Morishita et al. ...................... 365/201

FOREIGN PATENT DOCUMENTS 5-109295  4/1993  Japan.

Primary Examiner—Hoa T. Nguyen
Attorney, Agent, or Firm—McDermott, Will & Emery

[57] ABSTRACT

In an SRAM, a line for applying an internal power supply potential to a memory cell and a line applying an external power supply potential to the portion other than memory cell are separately provided, and an N channel MOS transistor is connected between line for the internal power supply potential and a line for a ground potential. MOS transistor becomes conductive with a predetermined resistance value in a conductive state during test mode. Thus, the potential of line, which has been precharged to internal power supply potential, rapidly decreases to a down-converted potential. Therefore, reduction in time required for a hold test is achieved.

5 Claims, 9 Drawing Sheets

STATIC SEMICONDUCTOR MEMORY DEVICE HAVING TEST MODE

BACKGROUND OF THE INVENTION

1. Field of the Invention

The present invention relates to static semiconductor memory devices, and particularly to a static semiconductor memory device having a test mode for detecting a defective memory cell readily allowing inversion of stored data.

2. Description of the Background Art

FIG. 10 is a block diagram showing an arrangement of a conventional static random access memory (hereinafter referred to as an SRAM).

Referring to FIG. 10, the SRAM has a power supply terminal 31, a ground terminal 32, a clock input terminal 33, a group of address signal input terminals 34, control signal input terminals 35 to 37, and a data input/output terminal 38. An external power supply potential extVcc is externally applied to power supply terminal 31. A ground potential GND is externally applied to ground terminal 32. External power supply potential extVcc and ground potential GND are generally supplied for the SRAM.

A clock signal CLK is externally applied to clock input terminal 33. Address signals A0 to An (where n is an integer greater than zero) are externally applied to group of address signal input terminals 34. A chip select signal /CS, a write enable signal /WE and an output enable signal /OE are externally applied to control signal input terminals 35 to 37, respectively. Data input/output terminal 38 is used for input of write data DI and output of read data DO.

In addition, the SRAM includes: a plurality of (here, assumed to be four for the clarity of description) memory cells MC1 to MC4 arranged in rows and columns; word lines WL1 and WL2 provided corresponding to respective rows; and pairs of bit lines BL1, /BL1 and BL2, /BL2 provided corresponding to respective columns.

Referring to FIG. 11, memory cell MC1 includes load resistors 61 and 62, driver transistors (N channel MOS transistors) 63 and 64, access transistors (N channel MOS transistors) 65 and 66, and storage nodes N1 and N2. Load resistors 61 and 62 are respectively connected between lines for external power supply potential extVcc and storage nodes N1, N2. Driver transistors 63 and 64 are connected between storage nodes N1, N2 and lines for ground potential GND, with respective gates connected to storage nodes N2 and N1. Access transistors 65 and 66 are respectively connected between storage nodes N1, N2 and bit lines BL1, /BL1, with respective gates connected to word line WL1.

Memory cell MC1 is activated when word line WL1 is brought to an H level, of a selection level, for making access transistors 65 and 66 conductive, and inactivated when word line WL1 is brought to an L level of a non-selection level, for making access transistors 65 and 66 non-conductive.

During writing operation, memory cell MC1 is activated, and one of bit lines BL1 and /BL1 is brought to the H level and the other to the L level in accordance with write data DI. Thereby, one of driver transistors 63 and 64 becomes conductive and the other non-conductive, so that the levels of bit lines BL1 and /BL1 are latched at storage nodes N1 and N2. After memory cell MC is inactivated, electric current is supplied for storage nodes N1 and N2 through load resistors 61 and 62 from lines for external power supply potential extVcc, so that levels of storage nodes N1 and N2, that is, write data DI, is retained.

During reading operation, when memory cell MC1 is activated, current flows to the line for ground potential GND through one of driver transistors 63 and 64 which is conductive from one of bit lines BL1 and /BL1 corresponding to the transistor, whereby the bit line attains to the L level. By comparing the levels of bit lines BL1 and /BL1 in this state, data is read from memory cell MC1.

In addition, the SRAM includes: bit line loads 41 to 44 for charging bit lines BL1 to /BL2 to prescribed potentials; equalizers 45 and 46 for equalizing potentials between pairs of bit lines BL1, /BL1 and BL2, /BL2 during reading operation; a pair of data input/output lines IO and /IO; and column selection gates 47 and 48 for connecting pairs of bit lines BL1, /BL1 and BL2, /BL2 and pair of data input/output lines IO and /IO.

Bit line loads 41 to 44 are formed of N channel MOS transistors diode-connected between lines for external power supply potential extVcc and one ends of bit lines BL1 to /BL2, respectively. Equalizers 45 and 46 are respectively connected between bit lines BL1 and /BL1 and between BL2 and /BL2, and formed of P channel MOS transistors with their gates receiving bit line equalize signals /BLEQ.

Column selection gate 47 includes an N channel MOS transistor connected between the other end of bit line BL1 and one end of data input/output line IO, and an N channel MOS transistor connected between the other end of bit line /BL1 and one end of data input/output line /IO, with gates of the N channel MOS transistors connected to one terminal of a column selection line CSL1. Column selection gate 48 includes an N channel MOS transistor connected between the other end of bit line BL2 and one end of data input/output line IO, and an N channel MOS transistor connected between the other end of bit line /BL2 and one end of data input/output line /IO, with gates of the N channel MOS transistors connected to one end of a column selection line CSL2.

The SRAM further includes registers 51 to 54, a row decoder 55, a control circuit 56, a column decoder 57, a write driver 58 and a sense amplifier 59.

Register 51 operates in synchronization with a clock signal CLK externally applied through clock input terminal 33, and latches address signals A0 to An externally applied through the group of address signal input terminals 34 for selectively applying them to row and column decoders 55 and 57. Register 52 operates in synchronization with clock signal CLK, and latches signals /CS, /WE and /OE externally applied through control signal input terminals 35 to 37 for applying them to control circuit 56.

Row decoder 55 raises one of the plurality of word lines WL1 and WL2 to the H level of the selection level, in accordance with address signals A0 to An applied from register 51. Control circuit 56 selects a prescribed operation mode in accordance with signals /CS, /WE and /OE applied from register 52 for controlling whole operation of the SRAM. Column decoder 57 raises one of the plurality of column selection lines CSL1 and CSL2 to the H level of the selection level, in accordance with address signals A0 to An applied from register 51.

Register 53 operates in synchronization with clock signal CLK, and latches write data DI externally applied through data input/output terminal 38 for applying it to write driver 58. Write driver 58 brings one of data input/output lines IO and /IO to the H level and the other to the L level in accordance with write data DI applied from register 53 for writing data DI to a selected memory cell.

Sense amplifier 59 compares levels of data input/output lines IO and /IO and applies data DO to register 54 in accordance with the comparison result. Register 54 operates in synchronization with clock signal CLK and externally outputs read data DO applied from sense amplifier 59 through data input/output terminal 38.

The operation of the SRAM shown in FIG. 10 and 11 will now be described. During writing operation, word line WL1, for example, is raised to the H level of the selection level by row decoder 55, so that memory cells MC1 and MC2 are activated. Thereafter, column selection line CSL1, for example, is raised to the H level of the selection level by column decoder 57 for making column selection gate 47 conductive, whereby activated memory cell MC1 is connected to write driver 58 through the pair of bit lines BL1 and /BL1 and the pair of data input/output lines IO and /IO.

Write driver 58 brings one of the pair of data input/output lines IO and /IO to the H level and the other to the L level in accordance with write data DI applied from register 53 for writing data to memory cell MC1. When word line WL1 and column selection line CSL1 fall to the L level, data is stored in memory cell MC1.

During reading operation, column selection line CSL1, for example, is raised to the H level of the selection level by column decoder 57 for making column selection gate 47 conductive, whereby the pair of bit lines BL1 and /BL1 are connected to sense amplifier 59 through the pair of data input/output lines IO and /IO. Thereafter, bit line equalize signal /BLEQ attains to the L level of an activation level, for making equalizers 45 and 46 conductive, whereby potentials of bit lines BL1, /BL1 and BL2, /BL2 are equalized.

After bit line equalize signal /BLEQ attains to the H level of an inactivation level, for making equalizer 45 and 46 non-conductive, word line WL1, for example, is raised to the H level of the selection level by row decoder 55, so that memory cells MC1 and MC2 are activated. Thus, current flows from one of the pair of bit lines BL1 and /BL1 to memory cell MC1 in accordance with data stored in memory cell MC1 and, responsively, one of the potentials of the pair of data input/output lines IO and /IO decreases. Sense amplifier 59 compares the potentials of the pair of data input/output lines IO and /IO, and applies read data DO to register 54 in accordance with the comparison result. Register 54 externally outputs read data DO through data input/output terminal 38.

For such SRAM, a hold test (a test for determining the ability of holding stored data) is performed under a low temperature environment before shipping. As load resistors 61 and 62 contained in memory cell MC include polysilicon, resistance values of load resistors 61 and 62 increase with decrease in temperature. Thus, under the low temperature environment, amount of current supplied from the line of external power supply potential extVcc to storage nodes N1 and N2 through load resistors 61 and 62 is reduced, thereby reducing stability of memory cell MC. If corresponding word line WL is raised to the H level for reading of data in this state, data in defective memory cell MC, which readily allows inversion of data, is inverted, due to column current flowing into memory cell MC from corresponding bit lines BL and /BL. Then, by comparing write data and read data in each memory cell MC, a defective memory cell which readily allows inversion of data is detected so as to eliminate the SRAM including such defective memory cell.

Such hold test however requires an equipment for the low temperature environment, disadvantageously increasing test cost.

To cope with this problem, as shown in FIG. 12, a method has been proposed in which a line 67 for supplying an internal power supply potential intVcc to memory cell MC and a line 68 for supplying external power supply potential extVcc to the portion other than memory cell MC are separately provided for making internal power supply potential intVcc lower than external power supply potential extVcc during test, so that current supplied for storage nodes N1 and N2 of memory cell MC is reduced and a defective memory cell is detected under an ordinary temperature environment. According to the method, the equipment for the low temperature environment is not required and reduction in test cost is achieved, as the low temperature environment is not necessary.

FIG. 13 is a diagram showing an arrangement of an internal power supply potential generation circuit for generating such internal power supply potential intVcc. Referring to FIG. 13, the internal power supply potential generation circuit includes a voltage-down converter 71 and a P channel MOS transistor 73. Voltage-down converter 71 includes a plurality of (assumed to be three in the figure) N channel MOS transistors 72 connected in series between a line 68 for external power supply potential extVcc and a line 67 for internal power supply potential intVcc. Each N channel MOS transistor 72 has its gate connected to its drain. In other words, each N channel MOS transistor 72 is diode-connected. P channel MOS transistor 73 is connected between line 68 for external power supply potential extVcc and line 67 for internal power supply potential intVcc, with its gate receiving a test signal TE.

During normal operation, test signal TE is brought to the L level of the inactivation level for making P channel MOS transistor 73 conductive, whereby internal power supply potential intVcc is equalized with external power supply potential extVcc. During test, test signal TE is brought to the H level of the activation level for making P channel MOS transistor 73 non-conductive, whereby internal power supply potential intVcc attains to extVcc-3Vth. It is noted that Vth is a threshold voltage of N channel MOS transistor 72.

Thus, external power supply potential extVcc is supplied for memory cell MC during normal operation for stabilizing its operation, whereas down-converted potential extVcc-3Vth is supplied for memory cell MC during test for inverting data in the defective memory cell under the ordinary temperature environment.

FIG. 14 is a circuit diagram showing an arrangement of a test signal generation circuit for generating test signal TE shown in FIG. 13. Referring to FIG. 14, the test signal generation circuit includes P channel MOS transistors 81 and 82, an N channel MOS transistor 83, inverters 84 and 85 and a capacitor 86. MOS transistors 81 and 83 are connected in series between a prescribed terminal (for example control signal input terminal 37) and a line for ground potential GND, with their gates both connected to line 68 for external power supply potential extVcc.

N channel MOS transistor 83 is used as an element with high resistance value for flowing a small amount of current from a node N1 between MOS transistors 81 and 83 to the line for ground potential GND. Inverters 84 and 85 are connected in series between a node N81 and an output node N83 of the test signal generation circuit. P channel MOS transistor 82 is connected between line 68 for external power supply potential extVcc and a node N82 between inverters 84 and 85, with its gate connected to output node N83. Capacitor 86 is connected between output node N83 and the line for ground potential GND.

During normal operation, external power supply potential extVcc or ground potential GND is applied to control signal input terminal 37 as signal /OE. In this case, P channel MOS transistor 81 becomes non-conductive and node N81 attains to the L level, whereby the potential of output node N83, that is, test signal TE, attains to the L level. At the time, P channel MOS transistor 82 becomes conductive and output node N83 is latched at the L level.

During the hold test, a super Vcc potential which is sufficiently higher than external power supply potential extVcc is applied to control signal input terminal 37. Thereby, P channel MOS transistor 81 becomes conductive and node N81 and hence test signal TE both attain to the H level.

In the method described with reference to FIGS. 12 to 14, however, the resistance values of load resistors 61 and 62 for memory cell MC are high and the amount of current flowing to the line for ground potential GND from line 67 for internal power supply potential intVcc is extremely small. As a result, significant time is required for internal power supply potential intVcc to decrease to down-converted potential extVcc-3Vth for stabilization after test signal TE is brought to the H level, thereby disadvantageously increasing time for testing.

Furthermore, external noise may be introduced to terminal 37 of the test signal generation circuit shown in FIG. 14, causing malfunction of the test signal generation circuit.

SUMMARY OF THE INVENTION

Therefore, a main object of the present invention is to provide a static semiconductor memory device capable of reducing time required for a hold test.

Another object of the present invention is to provide a static semiconductor memory device in which malfunction due to external noise is prevented.

In the static semiconductor memory device according to the present invention, a first transistor is provided which is connected between a second power supply line and a line for a reference potential and made conductive at a predetermined resistance value in a conductive state during test mode. Thus, at the start of the test, current is supplied from the second power supply line, which has been charged to an external power supply potential for the line for the reference potential through the first transistor, so that the second power supply line can attain to the down-converted potential faster than in the conventional example. As a result, reduction in test time is achieved.

A memory cell for the static semiconductor memory device preferably includes two sets of load resistors, driver transistors and access transistors. The present invention is especially effective in this case.

More preferably, an internal power supply potential generation circuit for the static semiconductor memory device includes at least one diode connected between the first and second power supply lines, and a second transistor which is connected in parallel thereto and made non-conductive during the test mode. Thus, the internal power supply potential generation circuit can easily be structured.

More preferably, in the static semiconductor memory device, a test signal generation circuit is further provided which outputs a test signal in accordance with input of a first clock signal with a predetermined period by a plurality of pulses, and the internal potential generation circuit and the first transistor operate in response to the test signal. Therefore, the probability that the external noise is introduced with the same period as that for the first clock signal is extremely reduced, so that malfunction due to external noise is prevented.

More preferably, the test signal generation circuit for the static semiconductor memory device includes: a plurality of registers in which the first stage receives the first clock signal and the remaining stages receive output signals from respective preceding stages in synchronization with a second clock signal, which is half the first clock signal, for outputting them to next stages; and a logic circuit outputting a test signal in accordance with mismatch of logics for output signals from the registers in odd stages and those in even stages. Thus, the test signal generation circuit can readily be structured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
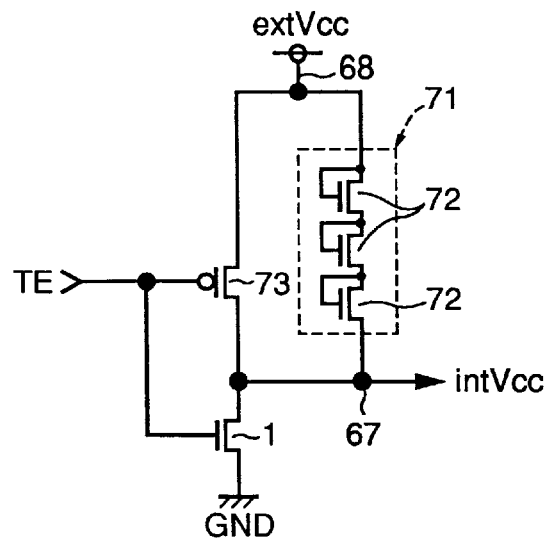
FIG. 1 is a circuit diagram showing an arrangement of an internal power supply potential generation circuit for an SRAM in accordance with a first embodiment of the present invention.
Figure 2A:
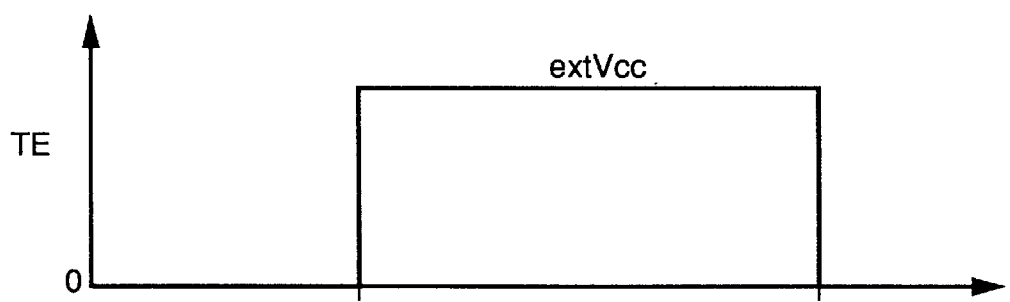
FIGS. 2A and 2B are time charts showing the operation of the internal power supply potential generation circuit shown in FIG. 1.
Figure 2B:
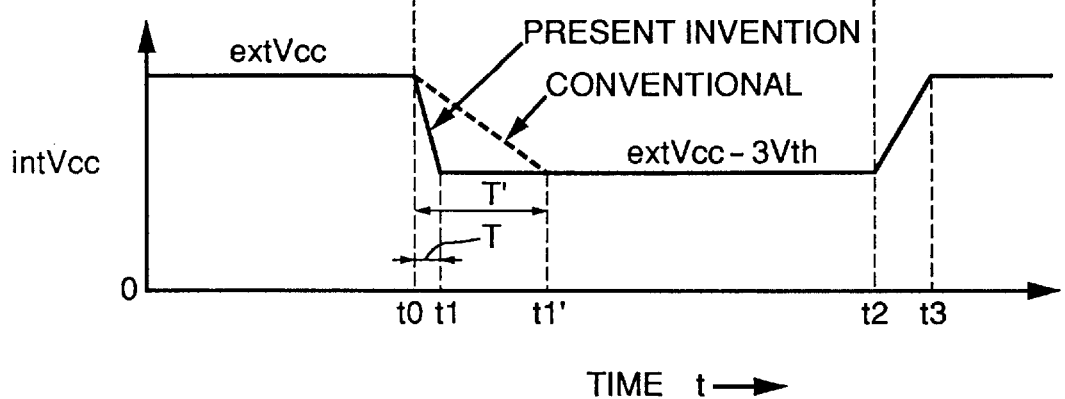
Figure 13:
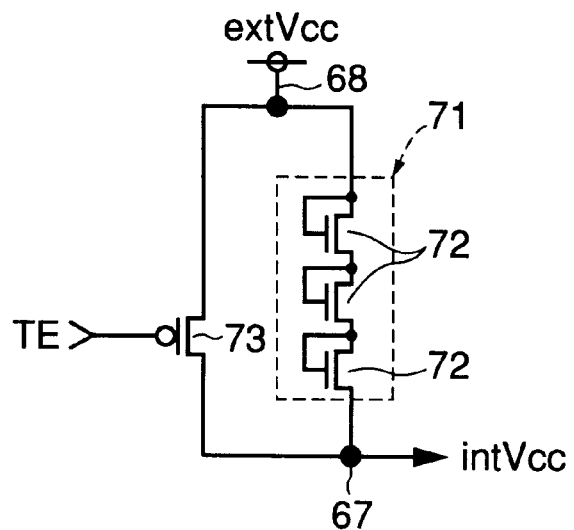
FIG. 13 is a circuit diagram showing an arrangement of an internal power supply potential generation circuit included in the SRAM described in conjunction with FIG. 12.

FIG. 1 is a circuit diagram showing the arrangement of the internal power supply potential generation circuit for the SRAM in accordance with a first embodiment and corresponding to FIG. 13. Referring to FIG. 1, the internal power supply potential generation circuit differs from that in FIG. 13 in that an N channel MOS transistor 1 is additionally provided. N channel MOS transistor 1 is connected between a line 67 for an internal power supply potential intVcc and a line for a ground potential GND, with its gate receiving a test signal TE. A resistance value in a conductive state is set for n channel MOS transistor 1 such that a predetermined amount of current is drawn when test signal TE attains to an H level of an activation level.

Prior to a hold test, data is written to every memory cell MC while maintaining test signal TE at an L level of inactivation level, as in the case during normal operation.

Figure 14:
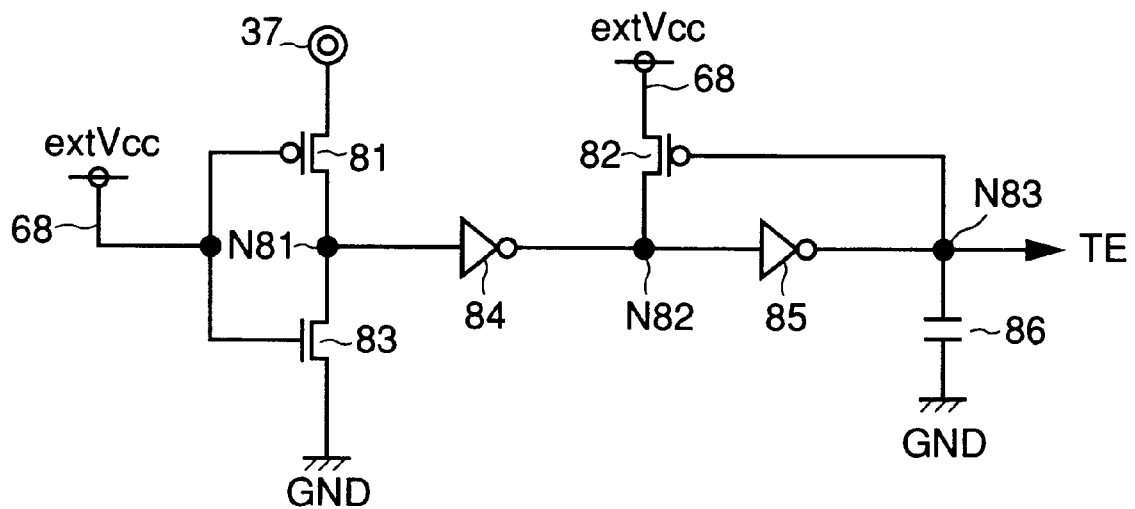
FIG. 14 is a circuit diagram showing an arrangement of a test signal generation circuit included in the SRAM described in conjunction with FIG. 12.

The hold test starts at time t0, and a super Vcc potential is applied to a terminal 37 in FIG. 14 to bring test signal TE to the H level (an external power supply potential extVcc). Thus, a P channel MOS transistor 73 and N channel MOS transistor 1 in the circuit shown in FIG. 1 respectively become non-conductive and conductive. At the time, a prescribed amount of current flows from line 67 for internal power supply potential intVcc to the line for ground potential GND through N channel MOS transistor 1, so that the potential of line 67 for internal power supply potential intVcc decreases to a down-converted potential extVcc-3Vth for stabilization faster than in the conventional example.

Now, time T, which is required for line 67 for internal power supply potential intVcc to decrease to down-converted potential extVcc-3Vth for stabilization after test signal TE rises to the H level, is calculated.

Assuming that capacitance C of line 67 for internal power supply potential intVcc is 10 PF, a threshold voltage Vth of N channel MOS transistor 72 is 0.8 V and current I' which flows to the line for ground potential GND from line 67 for internal power supply potential intVcc through a group of memory cells is 0.1 $\mu$A, the conventional time for stabilization T'=t1'-t0 would be T'=3CVth/I'=0.24 ms.

On the other hand, time for stabilization T=t1-t0 in the present invention would be T≈3CVth/I=24 ns, given that current I flowing from line 67 for internal power supply potential intVcc to the line for ground potential GND through N channel MOS transistor 1 is set at 1 mA. Thus, internal power supply potential intVcc decreases to down-converted potential extVcc-3Vth for stabilization with time T/T'=1/10$^4$ with respect to the conventional example.

Subsequently, data is read from each memory cell MC and a defective memory cell in which data has been inverted is detected, so that the SRAM including such defective memory cell is rejected. After the test is completed, application of super Vcc potential to terminal 34 in FIG. 14 stops at time t2, whereby test signal TE falls to the L level of the inactivation level. Thereby, P channel and N channel MOS transistors 73 and 1 in FIG. 1 become conductive and non-conductive, respectively, so that internal power supply potential intVcc rises to external power supply potential extVcc from down-converted potential extVcc-3Vth.

In the present embodiment, N channel MOS transistor 1 is made conductive with a prescribed resistance value in the conductive state at the start of the test, with N channel MOS transistor 1 connected between line 67 for internal power supply potential intVcc and the line for ground potential GND. Thus, internal power supply potential intVcc can rapidly decrease to down-converted potential extVcc-3Vth and reduction in test time can be achieved.

Figure 3A:
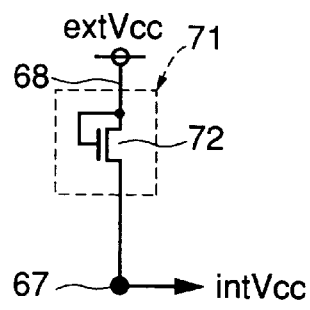
FIGS. 3A and 3B are circuit diagrams showing modifications of the internal power supply potential generation circuit shown in FIG. 1.
Figure 3B:
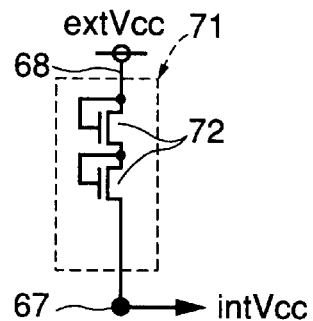
Figure 4A:
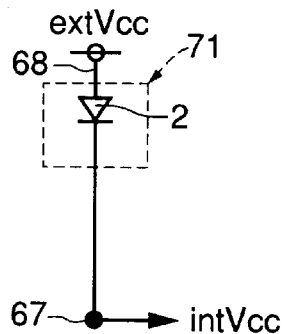
FIGS. 4A to 4C are circuit diagrams showing another modifications of the internal power supply potential generation circuit shown in FIG. 1.
Figure 4B:
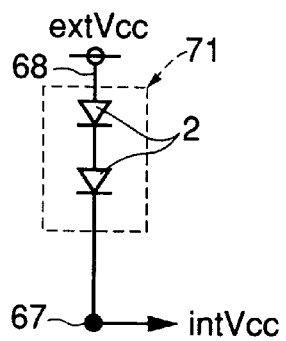
Figure 4C:
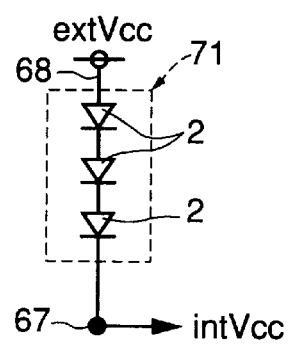
Figure 5A:
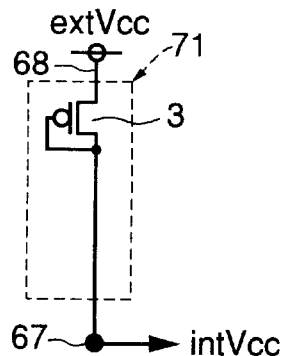
FIGS. 5A to 5C, 6A to 6C and 7A to 7C are circuit diagrams showing still another modifications of the internal power supply potential generation circuit shown in FIG. 1.
Figure 5B:
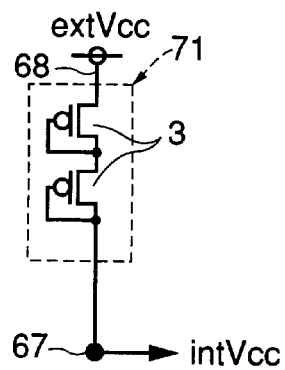
Figure 5C:
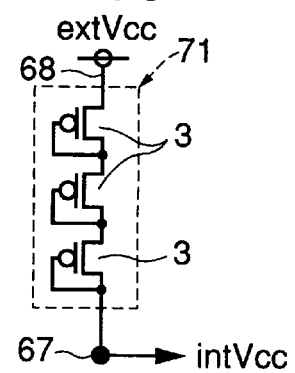
Figure 6A:
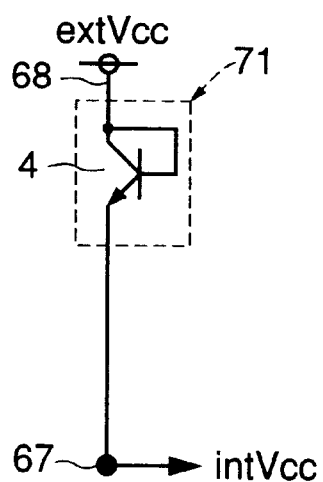
Figure 6B:
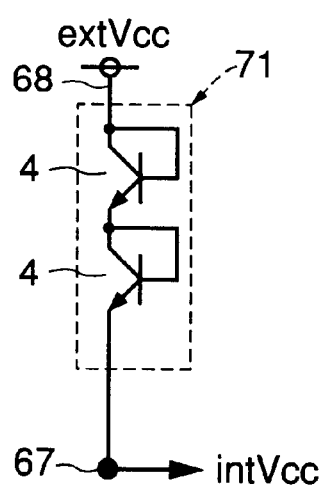
Figure 6C:
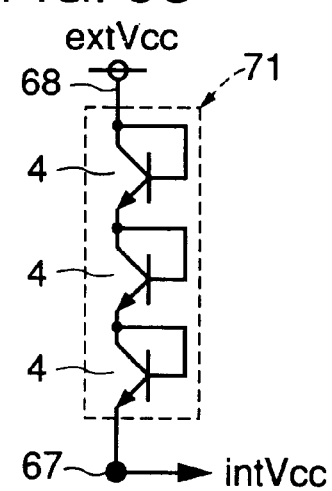
Figure 7A:
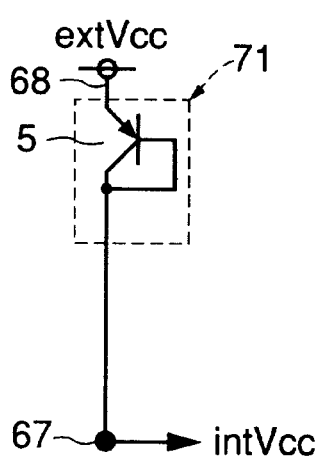
Figure 7B:
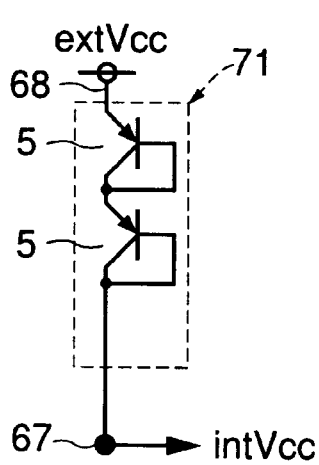
Figure 7C:
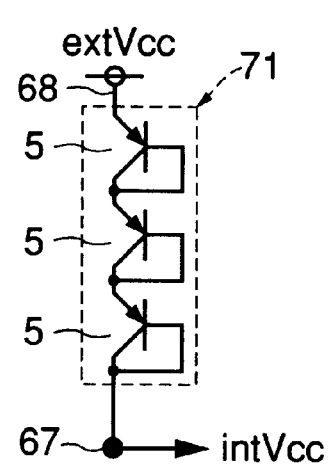

It is noted that while voltage-down converter 71 is formed of three diode-connected P channel MOS transistors 72, it may also be formed of only one or two P channel MOS transistors 72, as shown in FIGS. 3A and 3B. In addition, voltage-down converter 71 may be formed of more than four diode-connected P channel MOS transistors 72.

Further, as respectively shown in FIGS. 4A to 4C, 5A to 5C, 6A to 6C and 7A to 7C, a diode 2, a diode-connected P channel MOS transistor 3, a diode-connected NPN bipolar transistor 4 or a PNP bipolar transistor 5 may be employed in place of diode-connected P channel MOS transistor 72.

Second Embodiment

Figure 8:
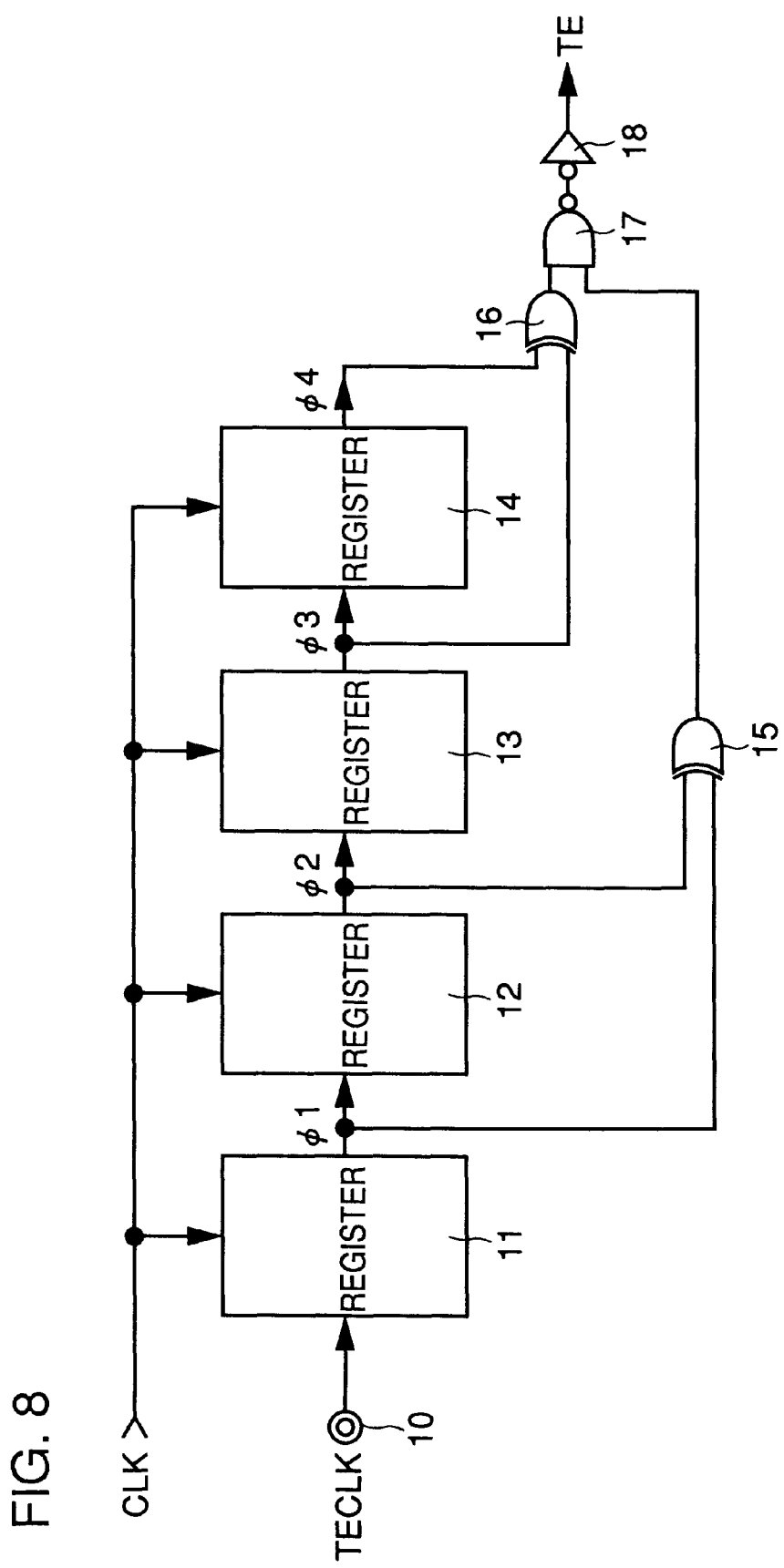
FIG. 8 is a block diagram showing an arrangement of a test signal generation circuit for an SRAM in accordance with a second embodiment of the present invention.

Referring to FIG. 8, a test signal generation circuit includes a test clock input terminal 10, registers 11 to 14, EX-OR gates 15 and 16, an NAND gate 17 and an inverter 18.

Figure 10:
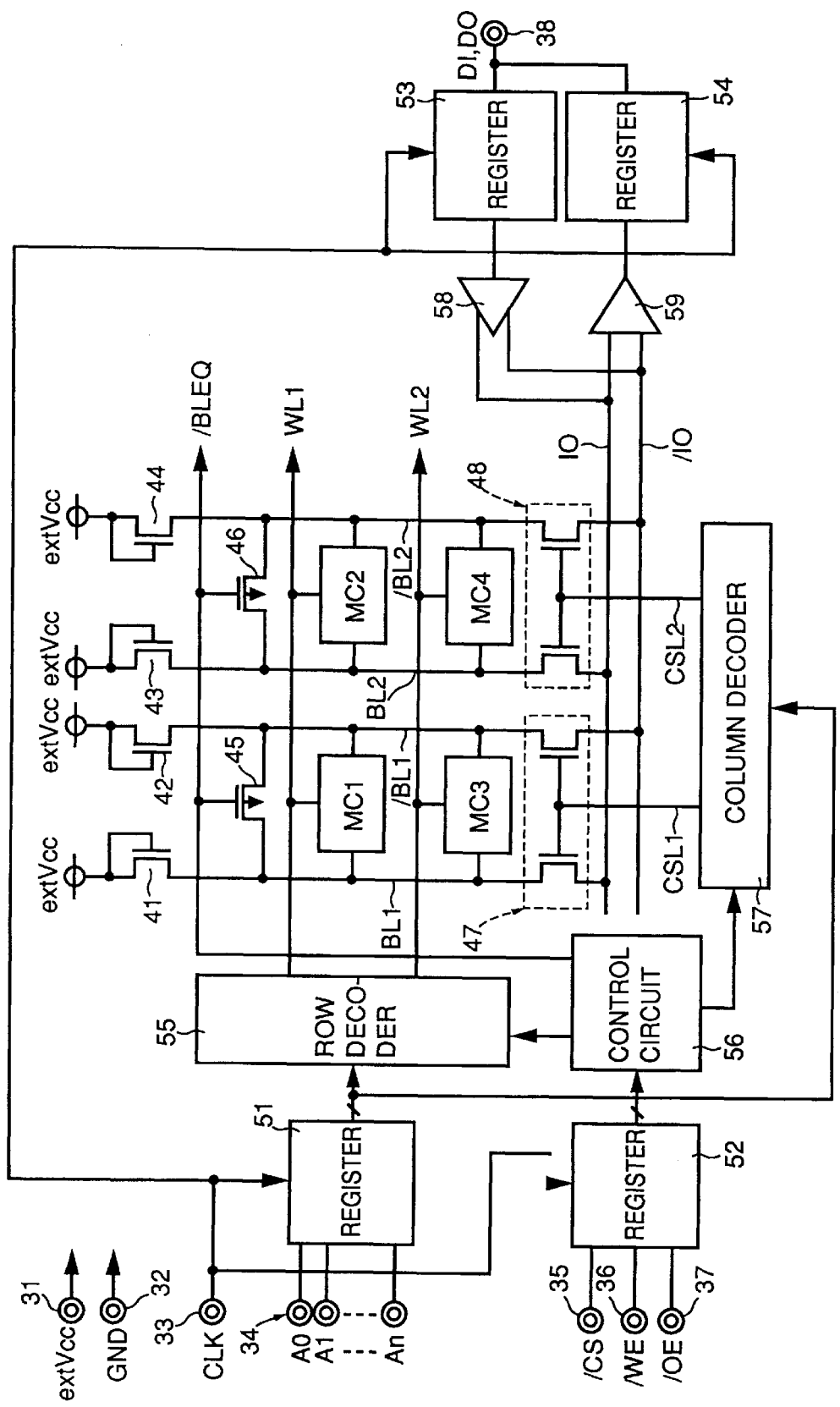
FIG. 10 is a block diagram showing an overall arrangement of a conventional SRAM.
Figure 11:
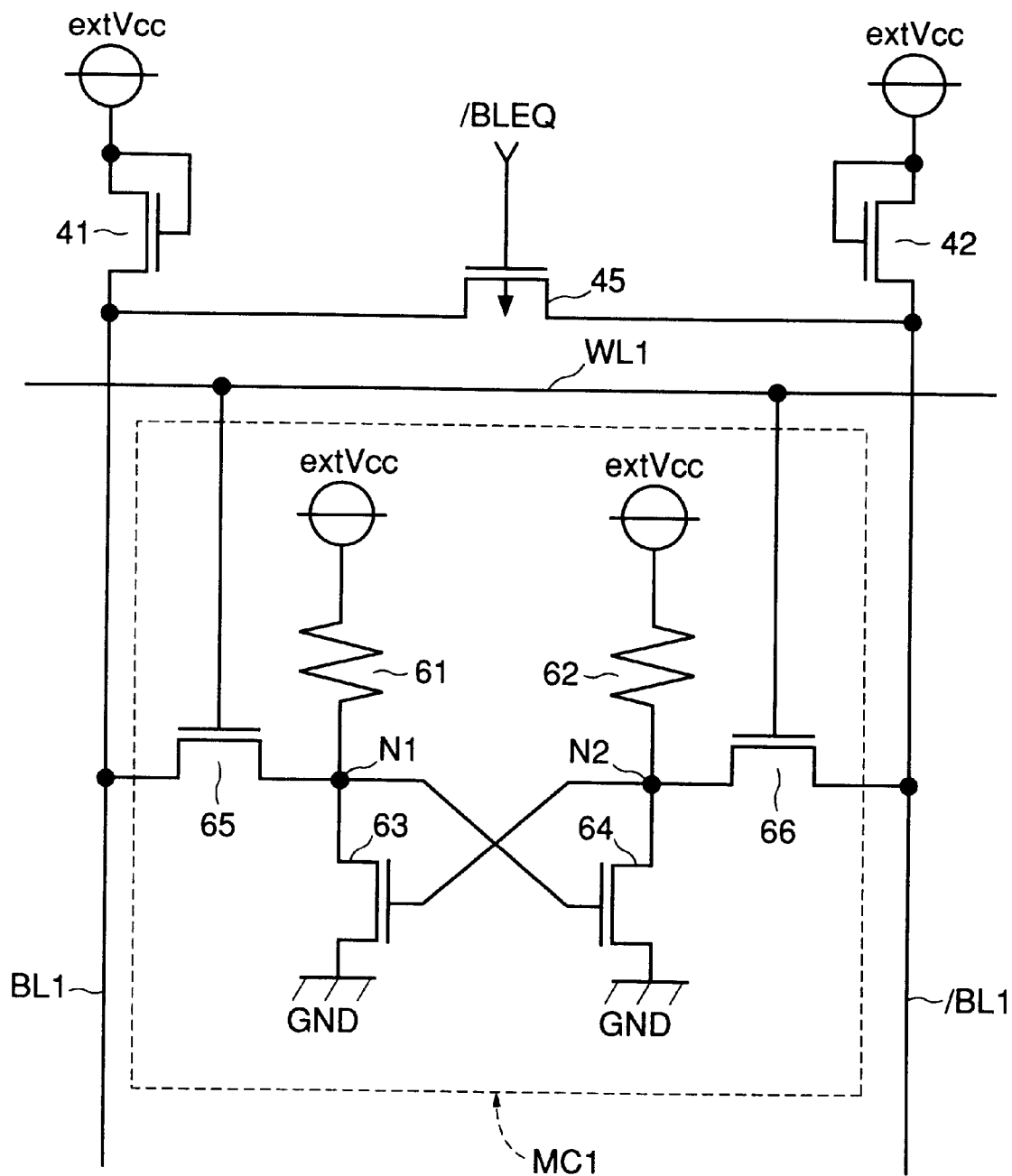
FIG. 11 is a circuit diagram showing an arrangement of a memory cell shown in FIG. 10.
Figure 12:
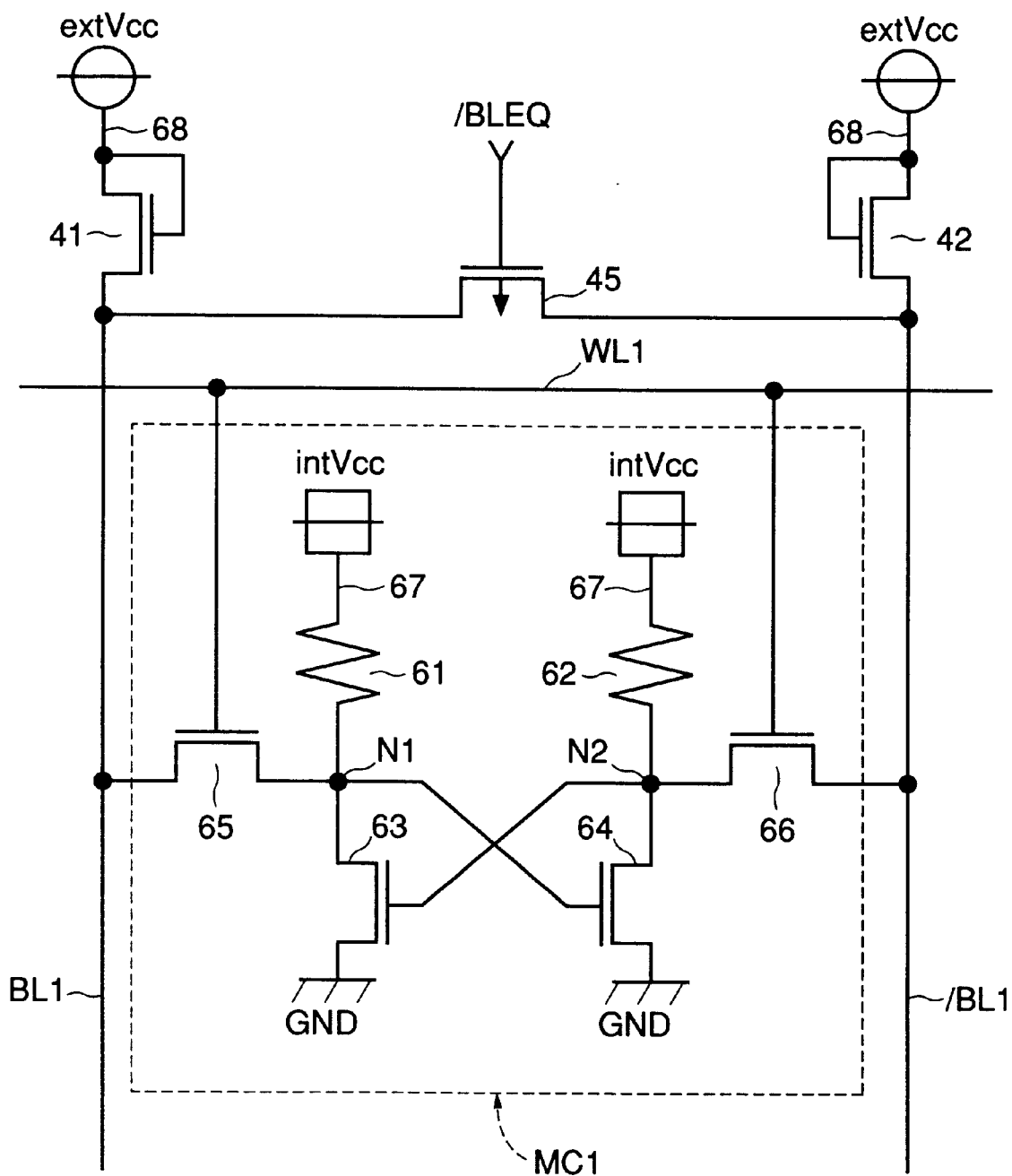
FIG. 12 is a circuit diagram showing a main portion of another conventional SRAM.

Register 11 in the first stage receives a test clock signal TECLK externally input through test clock input terminal 10. Registers 12 to 14 respectively receive output signals $\phi$1 to $\phi$3 from registers 11 to 13 in the preceding stages. Registers 11 to 14 operate in synchronization with clock signal CLK input to clock input terminal 33 in FIG. 10, and receive and output the levels of input signals TECLK, $\phi$1, $\phi$2 and $\phi$3 upon rising of clock signal CLK from the L level to the H level.

EX-OR gate 15 receives output signals $\phi$1 and $\phi$2 from registers 11 and 12. EX-OR gate 16 receives output signals $\phi$3 and $\phi$4 from registers 13 and 14. NAND gate 17 receives outputs from EX-OR gates 15 and 16. An output from NAND gate 17 is input to inverter 18. An output from inverter 18 passes to test signal TE.

Figure 9:
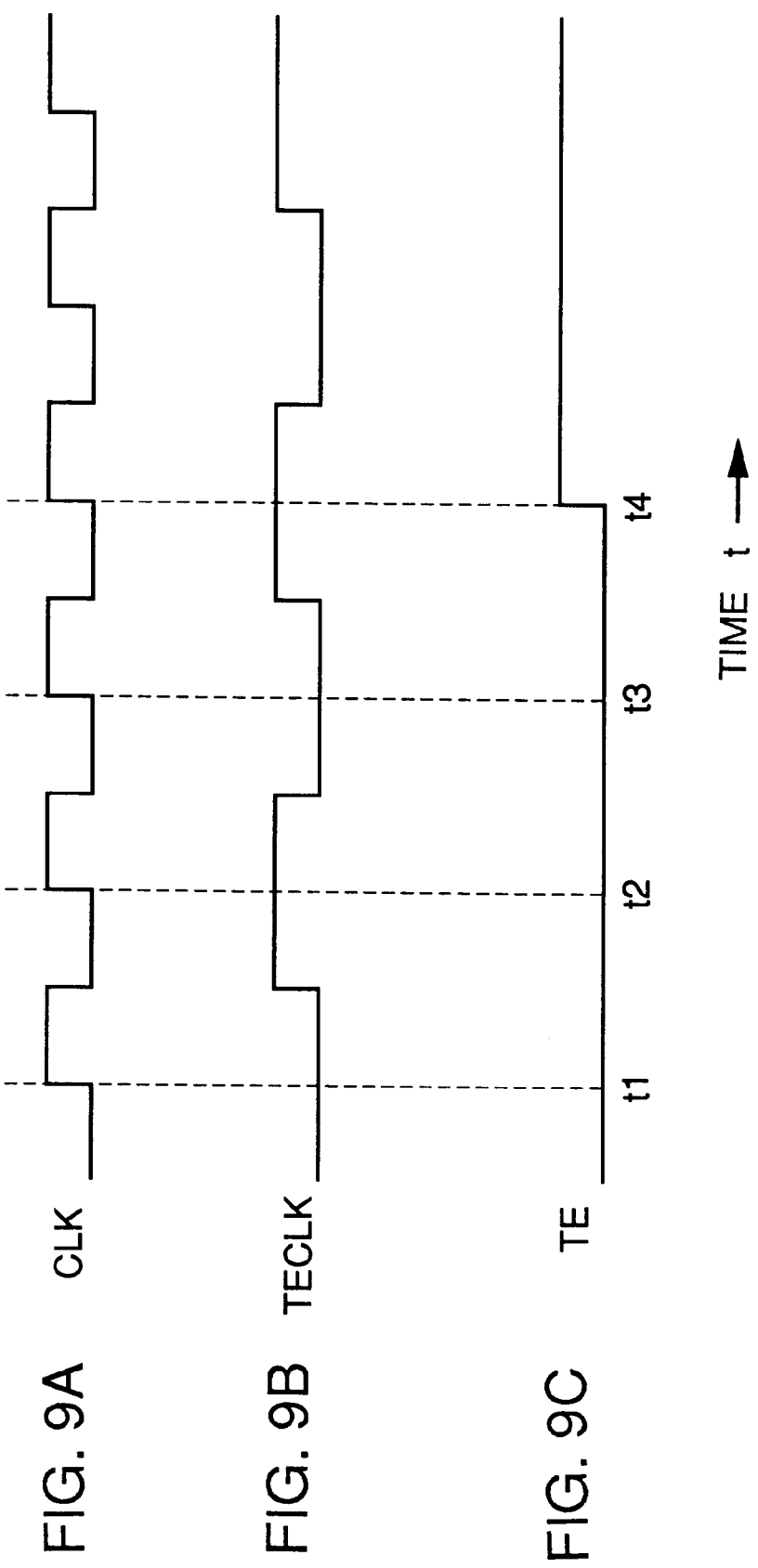
FIGS. 9A to 9C are time charts showing the operation of the test signal generation circuit shown in FIG. 8.

FIGS. 9A and 9B are time charts showing the operation of the test signal generation circuit shown in FIG. 8. During normal operation, test clock signal TECLK is not input and test clock terminal 10 is fixed at the L level. Thus, all of output signals $\phi$1 to $\phi$4 from registers 11 to 14 attain to the L level, so that test signal TE also attains to the L level.

During test, test clock signal TECLK is input to test clock input terminal 10. Test clock signal TECLK is a signal which has a period twice that for clock signal CLK. Thus, every time clock signal CLK rises from the L to H level, test clock signal TECLK attains to the L and H levels, alternately.

At the first rising of clock signal CLK (at time t1), test clock signal TECLK is at the L level, so that all of output signals $\phi$1 to $\phi$4 from registers 11 to 14 are also kept at the L level. Thus, test signal TE also remains at the L level of the inactivation level.

At the second rising of clock signal CLK (at time t2), test clock signal TECLK is at the H level, so that only output signal $\phi$1 from register 11 in the first stage is at the H level, and all of the other output signals $\phi$2 to $\phi$4 from registers 12 to 14 remain at the L level. Thus, test signal TE also remains at the L level of the inactivation level.

At the third rising of clock signal CLK (at time t3), test clock signal TECLK is at the L level, so that only output signal $\phi$2 from register 12 in the second stage is at H level, and all of the other output signals $\phi$1, $\phi$3 and $\phi$4 from registers 11, 13 and 14 are at the L level. Thus, test signal TE remains at the L level of the inactivation level.

At the fourth rising of clock signal CLK (at time t4), test clock signal TECLK is at the H level, so that output signals $\phi$1 and $\phi$3 from registers 11 and 13 in odd stages are at L level, and output signals $\phi$2 and $\phi$4 from registers 12 and 14 in even stages are at the L level. Thus, test signal TE rises to the H level of the activation level.

Thereafter, every time clock signal CLK rises to the H level, signals $\phi$1, $\phi$3 and $\phi$2, $\phi$4 alternately attain to the H level, and test signal TE is retained at the H level of the activation level. After the test is completed, input of test clock signal TECLK stops and test signal TE falls to the L level of the inactivation level.

In the present embodiment, rising of test signal TE to the H level of the activation level, cannot be achieved unless test clock signal CLK with a prescribed period is input by more than two pulses. Therefore, the probability that external noise is input with the same period as that for test clock signal CLK several times is extremely reduced, whereby malfunction caused by external noise is prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device having a test mode for detecting a defective memory cell readily allowing inversion of stored data, comprising:

a memory array including a plurality of memory cells arranged in rows and columns, a word line provided corresponding to each of said rows and a pair of bit lines provided corresponding to each of said columns;

a data input/output circuit for externally inputting/outputting data to and from said memory array;

a first power supply line for supplying an external power supply potential for a portion other than said memory cell;

a second power supply line connected to a power supply node of each of said memory cells;

internal power supply potential generation means connected between said first and second power supply lines and applying said external power supply potential to said second power supply line during normal operation and applying an down-converted potential down-converted from said external power supply potential to said second power supply line during said test mode; and a first transistor connected between said second power supply line and a line for a reference potential lower than said down-converted potential and made conductive with a predetermined resistance value in a conductive state during said test mode.

2. The static semiconductor memory device according to claim 1, wherein said memory cell includes:

first and second load resistors respectively connected between said power supply node and first and second storage nodes;

first and second driver transistors respectively connected between said first and second storage nodes and a line for a ground potential and having respective input electrodes connected to said second and first storage nodes; and first and second access transistors respectively connected between said first and second storage nodes and one and other of said corresponding pair of bit lines, and having respective input electrodes both connected to said corresponding word lines.

3. The static semiconductor memory device according to claim 2, wherein said internal power supply potential generation means includes at least one diode means connected between said first and second power supply lines for down-converting said external power supply potential by its threshold voltage, and a second transistor connected between said first and second power supply lines and made non-conductive during said test mode.

4. The static semiconductor memory device according to claim 1, further including test signal generation means for outputting a test signal indicating said test mode has been set in response to input of a first clock signal with a predetermined period by a plurality of pulses, wherein said internal power supply potential generation means and said first transistor operate in response to said test signal.

5. The static semiconductor memory device according to claim 4, wherein said test signal generation means includes a plurality of registers connected in series, a first stage of which receiving said first clock signal and each of which receiving an output signal from a preceding stage in synchronization with a second clock signal with a period which is half that for said first clock signal for outputting it to a next stage, and a logic circuit outputting said test signal in accordance with mismatch of logics between output signals from registers in odd and even stages of said plurality of registers.

* * * * *